United States Patent
Kwon et al.

(10) Patent No.: US 9,118,314 B2
(45) Date of Patent: Aug. 25, 2015

(54) ADAPTIVE BODY BIAS CIRCUIT AND SEMICONDUCTOR INTEGRATED CIRCUIT INCLUDING THE SAME

(75) Inventors: Seok-il Kwon, Seoul (KR); Hoi-jin Lee, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 175 days.

(21) Appl. No.: 13/484,603

(22) Filed: May 31, 2012

(65) Prior Publication Data

US 2013/0009673 A1  Jan. 10, 2013

(30) Foreign Application Priority Data

Jul. 6, 2011  (KR) .................... 10-2011-0066867

(51) Int. Cl.
*H03K 3/01* (2006.01)
*H03K 19/00* (2006.01)

(52) U.S. Cl.
CPC .................................. *H03K 19/0013* (2013.01)

(58) Field of Classification Search
CPC ............... H01L 2924/00; H01L 2924/0132; H01L 2924/01013; H01L 2924/01029; H01L 2924/01074
See application file for complete search history.

(56) References Cited

U.S. PATENT DOCUMENTS

| | | | | |
|---|---|---|---|---|
| 5,576,997 A | * | 11/1996 | Masuda et al. | 365/189.04 |
| 5,602,406 A | * | 2/1997 | Okabe | 257/207 |
| 5,619,189 A | * | 4/1997 | Sugawara | 340/3.71 |
| 7,479,818 B2 | * | 1/2009 | Park et al. | 327/218 |
| 2004/0071171 A1 | * | 4/2004 | Ghiasi | 370/535 |
| 2011/0242068 A1 | * | 10/2011 | Omoto | 345/204 |

FOREIGN PATENT DOCUMENTS

| | | |
|---|---|---|
| JP | 2000-236066 | 8/2000 |
| JP | 2004-289030 | 10/2004 |
| JP | 2005-123347 | 5/2005 |
| JP | 2007-103863 | 4/2007 |

* cited by examiner

*Primary Examiner* — Sibin Chen
(74) *Attorney, Agent, or Firm* — Ellsworth IP Group PLLC (57) ABSTRACT

An adaptive body bias (ABB) circuit and a semiconductor integrated circuit (IC) having the ABB circuit include: a logic circuit performing logic calculations, a clock line through which a clock signal is transmitted to the logic circuit, and at least one bias line through which a bias voltage is applied to the logic circuit, wherein the bias voltage is applied to a body of a metal oxide semiconductor (MOS) transistor constituting the logic circuit, and the bias line is arranged at a predetermined distance from the clock line to shield the clock signal from crosstalk due to other adjacent signal lines.

12 Claims, 10 Drawing Sheets

ADAPTIVE BODY BIAS CIRCUIT AND SEMICONDUCTOR INTEGRATED CIRCUIT INCLUDING THE SAME

CROSS-REFERENCE TO RELATED APPLICATIONS

This application claims the benefit of Korean Patent Application No. 10-2011-0066867, filed on Jul. 6, 2011, in the Korean Intellectual Property Office, the disclosure of which is incorporated herein in its entirety by reference.

BACKGROUND

When an operating voltage of a semiconductor IC is reduced to minimize power consumption of the semiconductor IC, a leakage current may increase, and performance of the semiconductor IC may be decreased. Thus, there are problems of consuming wiring resources and difficulty in circuit design.

SUMMARY

The present general inventive concept provides an adaptive body bias (ABB) circuit which enables reduction in consumption of wiring resources and simplification of circuit design, and a semiconductor integrated circuit (IC) including the ABB circuit.

According to a feature of the present general inventive concept, an adaptive body bias (ABB) circuit includes a logic circuit performing logic calculations, a clock signal line through which a clock signal is transmitted to the logic circuit, and at least one bias line through which a bias voltage is applied to the logic circuit, wherein the bias voltage is applied to a body of a metal oxide semiconductor (MOS) transistor constituting the logic circuit, and the at least one bias line is arranged at a predetermined distance from the clock signal line to shield the clock signal from crosstalk due to other adjacent signal lines.

The at least one bias line may be arranged adjacent to the clock signal line at a distance having a magnitude of a multiple of a width of the clock signal line.

The ABB circuit may comprise two bias lines, wherein the two bias lines are arranged at opposite sides of the clock signal line.

The ABB circuit may comprise one bias line, wherein the bias line is arranged at a first side of the clock signal line.

The ABB circuit may further comprise: a power line through which a power voltage is applied to the logic circuit; and a ground line through which a ground voltage is transmitted to the logic circuit, wherein the power line and/or the ground line are arranged at opposite sides of the at least one bias line in parallel with the clock line at a distance having a magnitude of a multiple of a width of the clock line.

The logic circuit may comprise a sequential logic circuit performing logic calculations in synchronization with the clock signal.

The at least one bias voltage may have a different level from a level of a power voltage applied to the logic circuit, wherein the bias voltage is a forward bias voltage or a reverse voltage.

According to another feature of the present general inventive concept, a semiconductor integrated circuit (IC) includes first through fourth logic blocks each including at least one adaptive body bias (ABB) circuit, a plurality of main clock lines through which a clock signal is transmitted to the first through fourth logic blocks, and a plurality of main bias lines that are arranged in pairs with the plurality of main clock lines and at a predetermined distance from the plurality of main clock lines, and shield the clock signal from crosstalk due to other adjacent signal lines, wherein a bias voltage is applied to the first through fourth logic blocks through the plurality of main bias lines, wherein the ABB circuit includes a logic circuit performing logic calculations, a local clock line that is connected to the main clock signals to transmit the clock signal to the logic circuit, and at least one local bias line that is connected to the main bias lines to apply the bias voltage to the logic circuit, and is arranged at a predetermined distance from the local clock line, and shields the clock signal from crosstalk due to other adjacent signal lines, wherein the bias voltage is a voltage applied to a body of a MOS transistor constituting the logic circuit.

The main clock signal lines and the local clock signal line may be arranged in an H-tree clock signal distribution manner.

The main bias lines may be arranged adjacent to the main clock signal lines at a distance that has a magnitude that is a multiple of a width of the main clock signal lines.

Two main bias lines may be arranged in a pair with one main clock signal line, wherein the two main bias lines are respectively arranged at opposite sides of the one main clock signal line.

One main bias line may be arranged in a pair with one main clock signal line, wherein the main bias line is arranged at a side of the one main clock signal line.

The semiconductor IC may further comprise a plurality of power lines through which a power voltage is applied to the ABB circuit of the first through fourth logic blocks and a plurality of ground lines through which a ground voltage is applied to the ABB circuit of the first through fourth logic blocks, wherein one of the plurality of power lines and the plurality of ground lines is arranged at an opposite side to the one main bias line around the one main clock signal line.

The logic circuit may include a sequential logic circuit performing logic calculations in synchronization with the clock signal.

The bias voltage may have a different level from a level of a power voltage applied to the logic circuit, and the bias voltage may be a forward bias voltage or a reverse voltage.

According to another feature of the present general inventive concept, a semiconductor integrated circuit (IC) includes a system on a chip (SoC) that includes: a plurality of semiconductor integrated circuits, each comprising at least one adaptive body bias (ABB) circuit. Each ABB circuit includes a logic circuit performing logic calculation, a clock signal line through which a clock signal is transmitted to the logic circuit, and at least one bias line through which a bias voltage is applied to the logic circuit, wherein the bias voltage is applied to a body of a metal oxide semiconductor (MOS) transistor constituting the logic circuit such that the at least one first bias line is arranged at a predetermined distance from the clock signal line to shield the clock signal from crosstalk due to other adjacent signal lines. The SoC further includes a memory system (MSYS) having a memory controller, a central processing unit (CPU) controlling the memory controller and operations of the plurality of semiconductor integrated circuits, and a system bus electrically connected to the central processing unit, the memory system; and the plurality of semiconductor integrated circuits.

Additional features and utilities of the present general inventive concept will be set forth in part in the description which follows and, in part, will be obvious from the description, and/or may be learned by practice of the present general inventive concept.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings of which.

DETAILED DESCRIPTION OF THE EXEMPLARY EMBODIMENTS

Reference will now be made in detail to the exemplary embodiments of the present general inventive concept, examples of which are illustrated in the accompanying drawings, wherein like reference numerals refer to the like elements throughout. The exemplary embodiments are described below to explain the present general inventive concept while referring to the figures.

Figure 1:
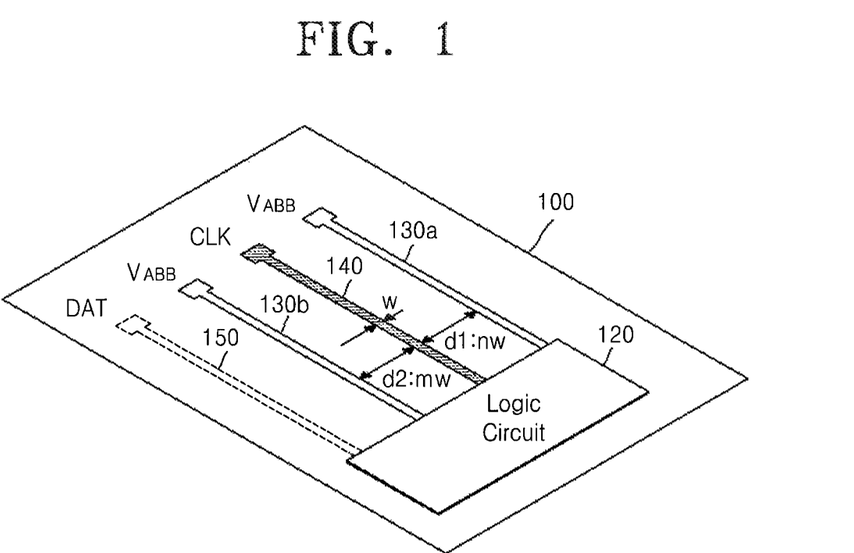
FIG. 1 is a diagram illustrating an adaptive body bias (ABB) circuit according to an exemplary embodiment of the present general inventive concept.

FIG. 1 is a diagram illustrating an adaptive body bias (ABB) circuit 100 according to an exemplary embodiment of the present general inventive concept. Referring to FIG. 1, the ABB circuit 100 includes a logic circuit 120 to conduct logic calculations, a clock line 140 through which a clock signal CLK is transmitted to the logic circuit 120, and bias lines 130a and 130b that are disposed at predetermined intervals from the clock signal line 140 and are used to apply a bias voltage to a body of a metal oxide semiconductor (MOS) transistor constituting the logic circuit 120, and to simultaneously shield a clock signal CLK line from crosstalk caused by other adjacent signal lines.

Spatially relative terms, such as "beneath," "below," "lower," "above," "upper," "adjacent" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the other signal lines in the figures are nearby, a clock signal line described as "adjacent" would then be oriented "nearby" the other signal lines. Thus, the term "adjacent" may encompass both an orientation of "next to" and "nearby."

The logic circuit 120 may be formed by, for example, a MOS transistor and may conduct logic calculations by logic algebra. The logic circuit 120 may be a synchronous logic circuit conducting logic calculations by being in synchronization with a clock signal CLK. The logic circuit 120 may be, for example, a flip flop, a latch, and/or an inter clock-gate. Meanwhile, while FIG. 1 illustrates a single logic circuit 120, the exemplary embodiment of the present general inventive concept is not limited thereto, and a plurality of logic circuits may also be included. When a plurality of logic circuits are included, a power voltage and a ground voltage are applied to a plurality of logic circuits 120. However, for convenience of description, the single logic circuit 120 will be described herein.

The clock signal line 140 is a signal line through which a clock signal CLK is transmitted to the logic circuit 120. The clock signal CLK may be supplied from a clock signal generator mounted inside the ABB circuit 100 and/or from the outside. The clock signal CLK may be supplied to the logic circuit 120 as an input signal and may control operation timing of the logic circuit 120. Accordingly, if a clock signal CLK that is transmitted to the logic circuit 120 via the clock signal line 140 is affected by an adjacent signal line, for example, by a data signal DAT transmitted via a data signal line 150, operation timing may not be consistent with other logic circuits, thereby causing a malfunction of the semiconductor IC including the ABB circuit 100. The adjacent signal line to the clock signal line 140 is not limited to a data line 150, but may also be other signal lines via which other clock signals are transmitted, and/or a signal line through which a control signal is transmitted.

Interference between the clock signal CLK and adjacent signals is caused by coupling capacitance and/or coupling inductance between signal lines. In particular, recently, due to the compact size and high integration degree of the semiconductor IC, distances between the signal lines inside the semiconductor IC are further reduced, and an operating frequency is increased to reduce power consumption, thus causing crosstalk between the clock signal and adjacent signals. Crosstalk causes a delay and/or a speed-up in signal timing, which makes timing analysis difficult when designing an IC. Also, crosstalk may cause a glitch, which refers to a malfunction due to a noise pulse, thereby degrading the total performance of the whole system. To prevent the crosstalk, sufficient distances between signal lines need to be guaranteed when designing a circuit. However, due to the high integration degree and the compact size of recently developed circuits, it is difficult to provide sufficient distances between the signal lines.

Meanwhile, a predetermined level of bias voltage $V_{ABB}$ is applied to the logic circuit 120 through the bias lines 130a and 130b. In detail, the bias lines 130a and 130b may be connected to a body terminal of a MOS transistor constituting the logic circuit 120 to apply a bias voltage $V_{ABB}$. The bias voltage $V_{ABB}$ may be applied from an ABB voltage generating unit inside the ABB circuit 100. A voltage level of the bias voltage $V_{ABB}$ may be different from a level of power voltage and/or a ground voltage, and may be varied according to an operating condition of an IC by using an ABB control circuit. The bias voltage $V_{ABB}$ may be forward biased or reverse biased to the logic circuit 120. As described above, by biasing the bias voltage $V_{ABB}$ to a body of the logic circuit 120, a leakage current of the logic circuit 120 and the performance of the logic circuit 120, that is, an operating speed of the logic circuit 120, may be controlled. Biasing of the bias voltage $V_{ABB}$, namely, adaptive body biasing (ABB), is a method of compensating with respect to non-uniformity and changes in a threshold voltage caused due to incompleteness of semiconductor processes during an operation of a circuit, and applying a predetermined level of voltage to a body of a MOS transistor to reduce a leakage current generated in unused circuits. Hereinafter, ABB will be described with reference to FIGS. 2A and 2B.

Figure 2A:
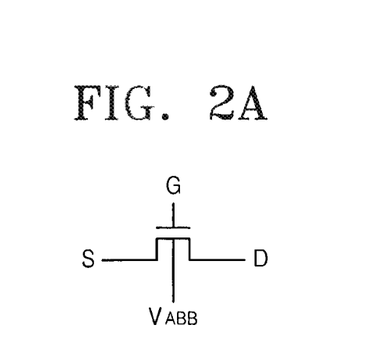
FIG. 2A illustrates an n-type metal oxide semiconductor (NMOS) transistor to which a bias voltage is applied, according to an exemplary embodiment of the present general inventive concept.
Figure 2B:
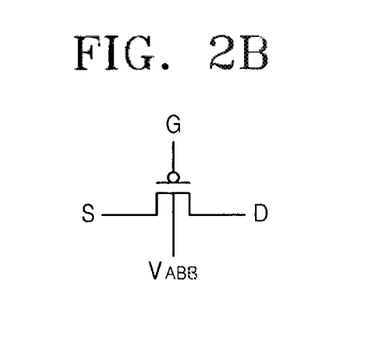
FIG. 2B illustrates a p-type metal oxide semiconductor (PMOS) transistor to which a bias voltage is applied, according to an exemplary embodiment of the inventive concept.

FIG. 2A illustrates an n-type metal oxide semiconductor (NMOS) transistor to which a bias voltage is applied, according to an embodiment of the inventive concept. FIG. 2B illustrates a p-type metal oxide semiconductor (PMOS) transistor to which a bias voltage is applied. The NMOS transistor and the PMOS transistor each include a body terminal B in addition to a gate G, a drain D, and a source S. In typical complementary metal oxide semiconductor (CMOS) circuits, the body terminal B of the NMOS transistor is connected to a ground terminal, and the body terminal B of the PMOS transistor is connected to a terminal having a predetermined voltage, such as a power terminal. However, as illustrated in FIGS. 2A and 2B, if a voltage different from a power voltage is applied to the body terminal B, a threshold voltage of the transistor is changed. For example, if a bias voltage $V_{ABB}$ is reverse biased between the body terminal B and the source terminal S, a threshold voltage increases, thereby decreasing a speed of a circuit including the NMOS transistor and/or the PMOS transistor and reducing a leakage current of the circuit that includes the NMOS transistor and/or the PMOS transistor. On the other hand, if a bias voltage $V_{ABB}$ is forward biased between the body terminal B and the source terminal S, the threshold voltage is decreased, thereby increasing the speed of the circuit and increasing the leakage current of the circuit. By using these properties of ABB, problems with respect to the leakage current and the non-uniformity of the threshold voltage, which are inevitable in semiconductor processes, may be solved at the same time. That is, in a circuit designed to have a large threshold voltage, a forward bias is applied between the body terminal B and the source terminal S to adjust a desired speed so that the leakage current is reduced. In a circuit having a low threshold voltage, a reverse bias is applied to maintain an appropriate speed and to reduce a leakage current. Also, if the circuit is not operating, a large reverse bias may be applied so that the leakage current hardly flows.

Referring to FIG. 1 again, the bias lines 130a and 130b to perform ABB in the ABB circuit 100 are each in pairs with the clock signal line 140, and may be disposed adjacent to the clock signal line 140 at predetermined intervals. In detail, the bias line 130a may be arranged at a first side of the clock signal line 140 by a distance d1 that is n times a width w of the clock signal line 140 (d1=n·w), where n is a positive integer.

The bias line 130b may be arranged at a second side of the bias line 130a by a distance d2 that is m times the width of the clock signal line 140 (d2=m·w), where m is a positive integer. The distance d1 and the distance d2 may be identical (n=m) or different (n≠m) in terms of a floorplan of a circuit. Also, the bias lines 130a and 130b may be arranged parallel to the clock signal line 140. If a wiring length is short, mutual impedance is large according to the width of the clock signal line 140, and thus, the appropriate wiring distances d1 and d2 as described above need to be maintained, and optimum wiring distances may be determined based on experiments. By arranging the bias lines 130a and 130b as described above, a clock signal CLK may be shielded from crosstalk due to other adjacent signal lines, and thus, operation timing between logic circuits may be consistent, thereby increasing operational reliability of the semiconductor IC, including the ABB circuit 100.

The ABB circuit 100 described above may control a leakage current and an operational speed thereof through ABB of the logic circuit 120, thereby efficiently controlling a circuit considering both power consumption and performance of the circuit. In addition, by arranging the bias lines 130a and 130b each in pairs with the clock signal line 140 as described above, a power mesh of an additional bias voltage $V_{ABB}$ may be not necessary to perform ABB, and another clock shield structure is not necessary. Thus, the circuit design may be simplified, and consumption of wiring resources may also be greatly reduced.

Figure 3A:
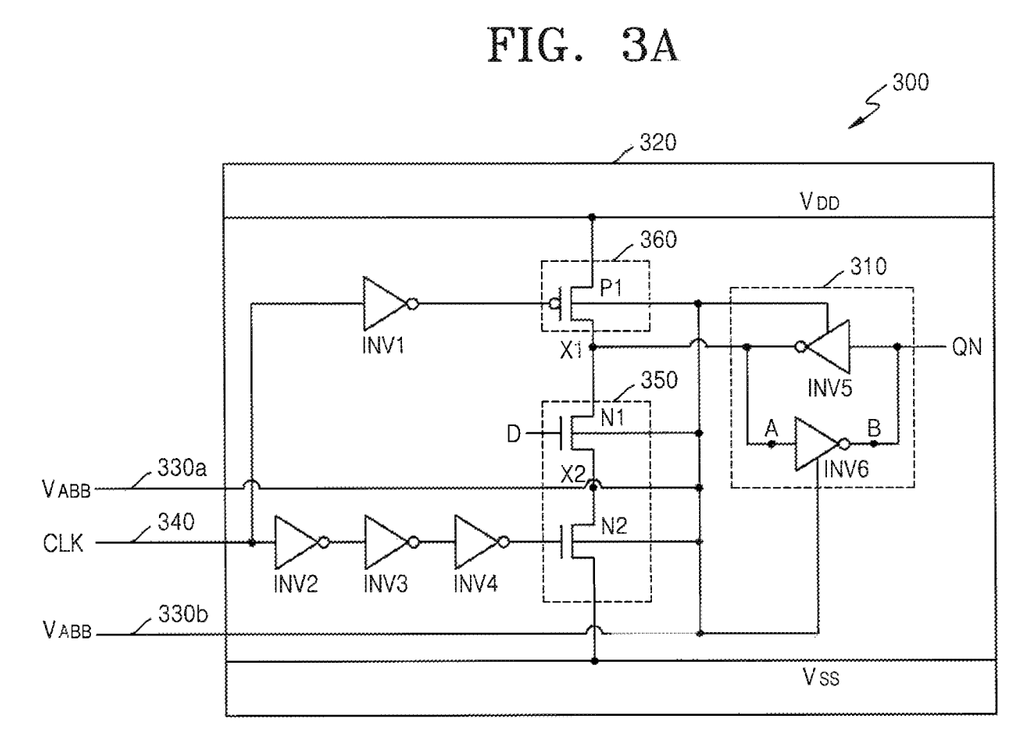
FIG. 3A is a circuit diagram illustrating the ABB circuit of FIG. 1 comprising a flip-flop logic circuit.

FIG. 3A is a circuit diagram illustrating an ABB circuit 300 that includes a flip-flop as a logic circuit. Referring to FIG. 3A, the logic circuit of the ABB circuit 300 may be a flip flop 320 comprising a precharge transistor 360, an evaluation circuit 350, and a latch portion 310. The ABB circuit 300 may include a clock signal line 340 through which a clock signal CLK is transmitted to the flip flop 320 and bias lines 330a and 330b through which a bias voltage $V_{ABB}$ is applied to the flip flop 320. In particular, the bias lines 330a and 330b may be arranged opposite to each other around the clock signal line 340, thereby shielding the clock signal CLK from crosstalk due to adjacent signal lines when the clock signal CLK is input to the flip flop 320. Hereinafter, the structure of the flip flop 320 and an ABB operation in the flip flop 320 will be described in detail.

The precharge transistor 360 is formed of a PMOS transistor P1, and is connected between a power voltage $V_{DD}$ and a node X1. The precharge transistor 360 precharges the node X1 while a clock signal CLK applied via the clock signal line 340 and an inverter Inv1 is at a low level. A signal precharged to the node X1 is latched by using the latch portion 310. The evaluation circuit 350 may include an NMOS transistor N1 connected between the node X1 and a node X2, and an NMOS transistor N2 connected between the node X2 and a ground voltage $V_{SS}$. The NMOS transistor N2 operates as a discharge transistor. The NMOS transistor N1 is controlled by an input signal D, and the NMOS transistor N2 is controlled by a clock signal CLK applied via the clock signal line 340 and inverters Inv2 through Inv4. In detail, the evaluation circuit 350 may evaluate the input signal D at a high level of the clock signal CLK applied via the NMOS transistor N2, and may selectively discharge a signal of the node X1 according to a level of the input signal D. While being in a connected state to the node X1, the latch portion 310 may be formed of inverters Inv5 and Inv6, and may latch a signal of the node X1.

Meanwhile, a bias voltage $V_{ABB}$ is applied to the precharge transistor 360, the evaluation circuit 350, and the inverters Inv1 through Inv6 through the bias lines 330a and 330b at the two sides of the clock signal line 340. In detail, the bias lines 330a and 330b are connected to body terminals of transistors constituting the precharge transistor 360, the evaluation circuit 350, and the inverters Inv1 through Inv6. By applying a forward bias voltage $V_{ABB}$ via the bias lines 330a and 330b, a threshold voltage of the precharge transistor 360 and/or the discharge transistor may be lowered to increase the operational speed of the flip flop 320. By applying a reverse bias voltage, a leakage current of each transistor may be reduced while maintaining an appropriate speed. When the flip flop 320 is not in operation, a large reverse bias voltage $V_{ABB}$ may be applied to prevent a leakage current of each transistor. For example, when the precharge transistor 360 is activated to precharge the node X1 to a power voltage $V_{DD}$, a forward bias voltage may be applied to increase a speed of precharging, and/or a reverse bias voltage may be applied and a leakage current may be reduced during a precharging operation. Also, while the discharge transistor N2 of the evaluation circuit 350 is operating, a large reverse bias voltage may be applied to the precharge transistor 360 to thereby prevent a leakage current. The bias lines 330a and 330b may be connected to bodies of the transistors constituting the inverters Inv1 through Inv4 and the latch portion 310 connected to the clock signal line 340 to enable ABB as described above.

Figure 3B:
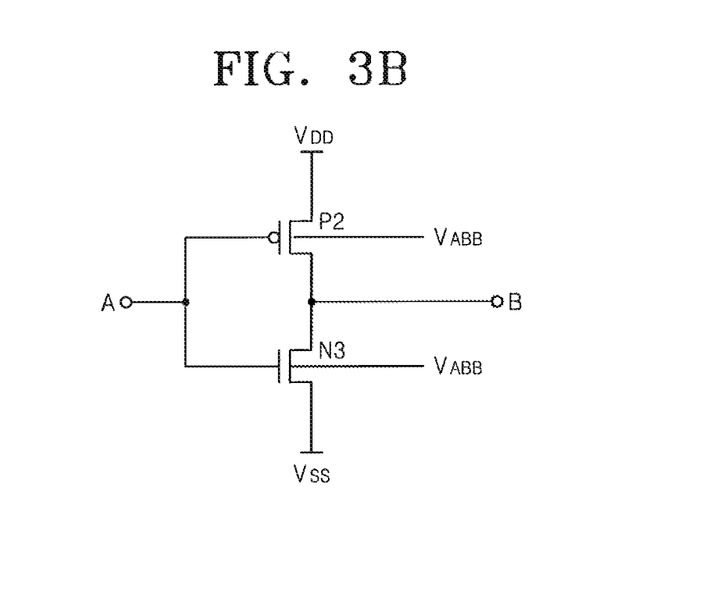
FIG. 3B is a detailed circuit diagram illustrating an inverter of a latch portion of FIG. 3A.

FIG. 3B is a detailed circuit diagram illustrating the inverter Inv6 of the latch portion 310 of FIG. 3A. Referring to FIG. 3B, a PMOS transistor P2 and an NMOS transistor N3 are serially connected between a power voltage $V_{DD}$ and a ground voltage $V_{SS}$. A gate of the PMOS transistor P2 and a gate of the NMOS transistor N3 may be connected to a node A, and a source of the PMOS transistor P2 and a drain of the NMOS transistor N3 may be connected to a node B. Bias lines are connected to a body of the PMOS transistor P2 and a body of the NMOS transistor N3 to apply a bias voltage. Accordingly, when the PMOS transistor P2 is turned on to be precharged with a power voltage $V_{DD}$ and/or is turned off, and/or conversely, when the NMOS transistor N3 is turned on and/or turned off, a leakage current and an operational speed of each transistor may be controlled by using the bias voltage $V_{ABB}$.

As described above, as the leakage current and the operational speed of the transistors constituting the flip flop 320 may be controlled by applying a bias voltage $V_{ABB}$ via the bias lines 330a and 330b, power consumption of the flip flop 320 may be reduced, and a high operational speed of the flip flop 320 may be obtained. Also, the clock signal CLK applied to the flip flop 320 may be protected from crosstalk due to adjacent signals, thereby preventing a malfunction of the flip flop 320.

Figure 4A:
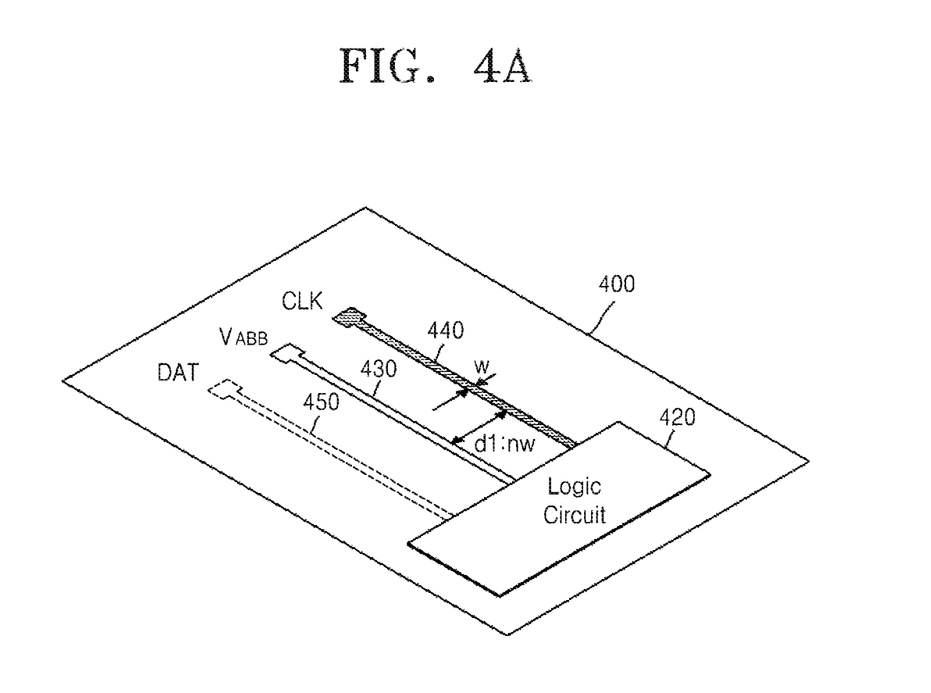
FIGS. 4A through 4C are block diagrams illustrating an ABB circuit according to another exemplary embodiment of the present general inventive concept.
Figure 4B:
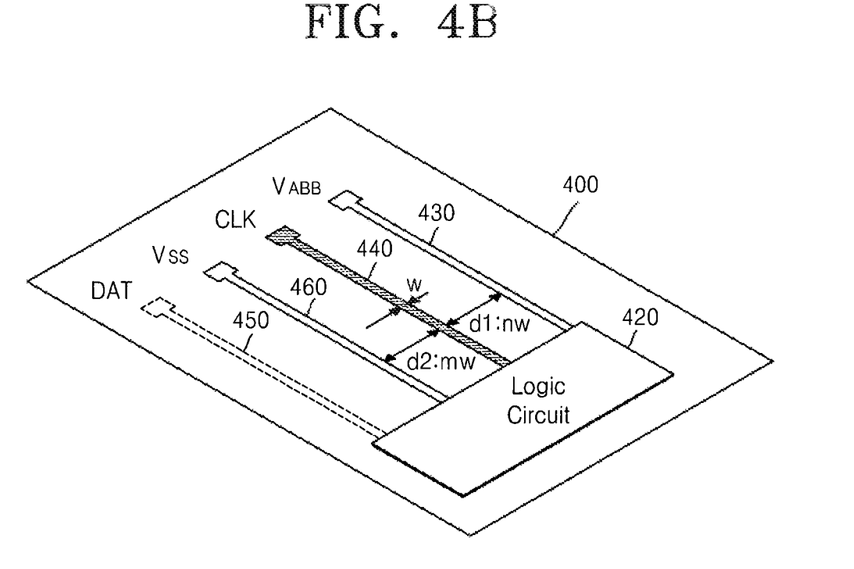
Figure 4C:
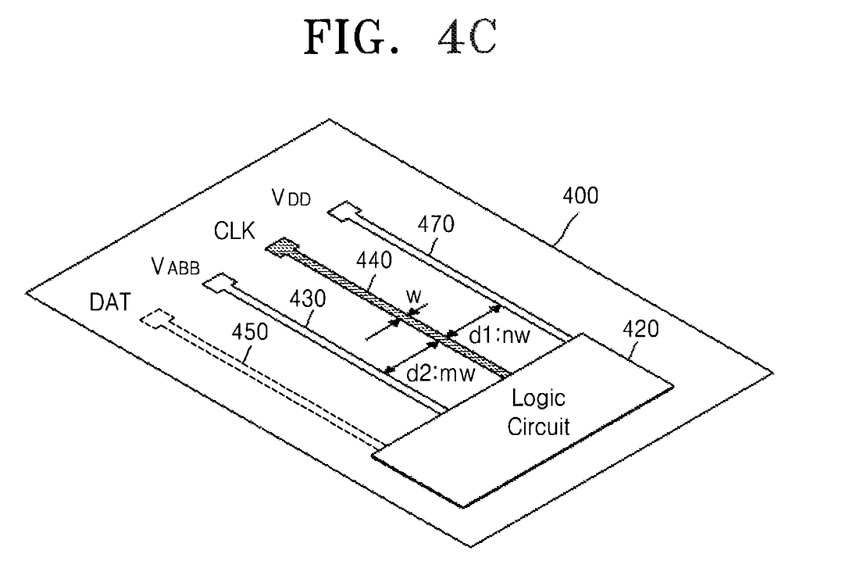

FIGS. 4A through 4C are block diagrams illustrating an ABB circuit 400 according to other exemplary embodiments of the present general inventive concept. The ABB circuit 400 of FIG. 4A may comprise a clock signal line 440 and other signal lines that are arranged at a distance d1. is the distance d1 may be determined to be n times a width w of the clock signal line 440 (d1=n·w), where n is a positive integer. A bias line 430 may be arranged in parallel at a first side of the clock signal line 440 at the distance d1 from the clock signal line 440. Accordingly, consumption of wiring resources may be reduced and a clock signalmay be effectively shielded in an environment in which other signal lines such as a data signal line 450 are arranged adjacent at the first side of the clock signal line 440.

FIGS. 4B and 4C each illustrate an ABB circuit 400 in which the bias line 430 is arranged at a first side of a clock signal line CLK 440, and a power line $V_{DD}$ 470 and/or a ground line $V_{SS}$ 460 is arranged at a second side, which is opposite to the first side, to shield a clock signal line CLK 440 from crosstalk due to other adjacent signals. Referring to FIG. 4B, the bias line 430 is arranged at a distance d1 from the clock signal line 440, and at an opposite side with respect to the clock signal line 440. A ground line 460 may be arranged at a distance d2 that is m times a width w of the clock signal line 440 (d2=m·w), where m is a positive integer. The distance d1 and the distance d2 may be identical (n=m) or different (n≠m) in terms of a floorplan of a circuit. Referring to FIG. 4C, a power line $V_{DD}$ 470 may be formed at a first side of the clock signal line 440 by the distance d1, and a bias line 430 may be arranged at a second side of the clock signal line 440, which is opposite to the first side, by the distance d2. Likewise, the distance d1 and the distance d2 may be identical or different.

According to the ABB circuits 400 illustrated in FIGS. 4B and 4C, when a power voltage line $V_{DD}$ 470 and/or a ground voltage line $V_{SS}$ 460 have to be arranged adjacent to a clock signal line 440, and/or if a circuit surface area is limited due to highly integrated logic circuits, bias lines may be effectively arranged to enable ABB and clock shielding.

Figure 5:
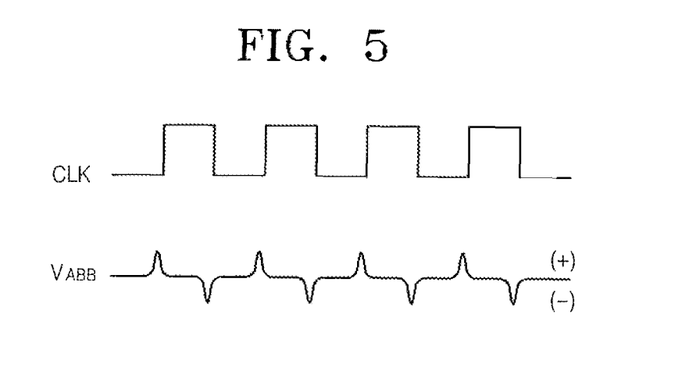
FIG. 5 illustrates boosting of a bias voltage according to a clock signal.

FIG. 5 illustrates boosting of a bias voltage according to a clock signal. As described above, a bias voltage $V_{ABB}$ is uniformly applied to a logic circuit with a different level from that of a power voltage and/or a ground voltage. The bias voltage $V_{ABB}$ may shield a clock signal from crosstalk due to other signal lines that are adjacent to the clock signal line. However, the clock signal, which is toggled to a high operating frequency in a high performance semiconductor IC, may affect other adjacent signals causing crosstalk. Accordingly, a bias voltage $V_{ABB}$ of a bias line adjacent to the clock signal line is affected by the clock signal interference, and the bias voltage $V_{ABB}$ is boosted. The bias voltage $V_{ABB}$ may be respectively boosted in a positive (+) direction and a negative (−) direction at rising and falling edges of the clock signal CLK. Due to the variation in the level of the bias voltage $V_{ABB}$, the leakage current and the operational speed of the logic circuit to which the bias voltage $V_{ABB}$ is applied are also boosted. For example, when a forward bias voltage $V_{ABB}$ of 0.1 V is applied to increase an operational speed of the logic circuit, the bias voltage $V_{ABB}$ may be boosted at a rising edge of a clock signal CLK to be boosted to 0.11 V, which is in the positive (+) direction, thereby further increasing the operational speed. On the other hand, at a falling edge of the clock signal CLK, the bias voltage $V_{ABB}$ may be boosted to 0.99 V which is in the negative (−) direction, thereby reducing the leakage current of the logic circuit.

Figure 6:
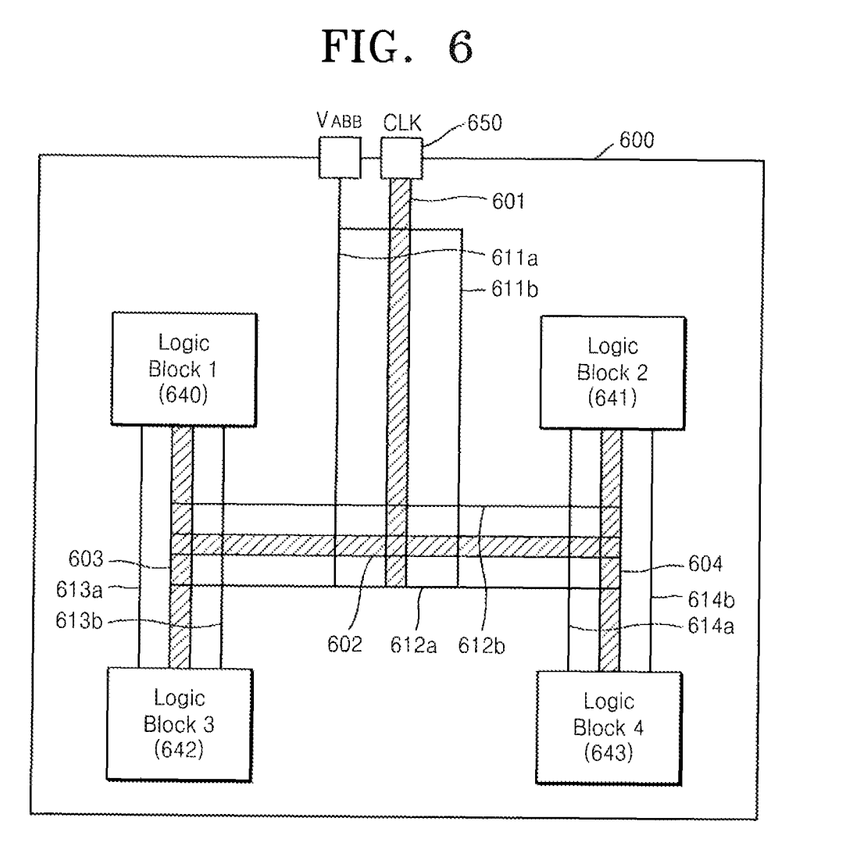
FIG. 6 is a schematic block diagram illustrating a semiconductor integrated circuit (IC) according to an exemplary embodiment of the present general inventive concept.

FIG. 6 is a schematic block diagram illustrating a semiconductor IC 600 according to an exemplary embodiment of the present general inventive concept. Referring to FIG. 6, the semiconductor IC 600 may include first through fourth logic blocks 640, 641, 642, and 643, main clock signal lines 601, 602, 603, and 604 through which a clock signal is transmitted to the first through fourth logic blocks 640, 641, 642, and 643, and main bias lines 611a, 611b, 612a, 612b, 613a, 613b, 614a, and 614b through which a bias voltage is applied to the first through fourth logic blocks 601, 602, 603, and 604 and which are respectively arranged in pairs with each of the main clock signal lines 601, 602, 603, and 604 at predetermined intervals from the main clock signal lines 601, 602, 603, and 604 to shield a clock signal from crosstalk due to other adjacent signal lines. The first through fourth logic blocks 640, 641, 642, and 643 may comprise at least one ABB circuit. The ABB circuit may comprise a logic circuit to perform logic calculations, at least one local clock signal line that is connected to the main clock signal lines to transmit a clock signal to the logic circuit, and a local bias line that is connected to the main bias lines to apply a bias voltage to the logic circuit and are arranged at predetermined intervals from the local clock signal line to shield the clock signal from crosstalk due to other adjacent signal lines. While a power voltage $V_{DD}$ and a ground voltage $V_{SS}$ are applied to the semiconductor IC 600, for convenience of description, a detailed explanation thereof will be omitted below.

Figure 7:
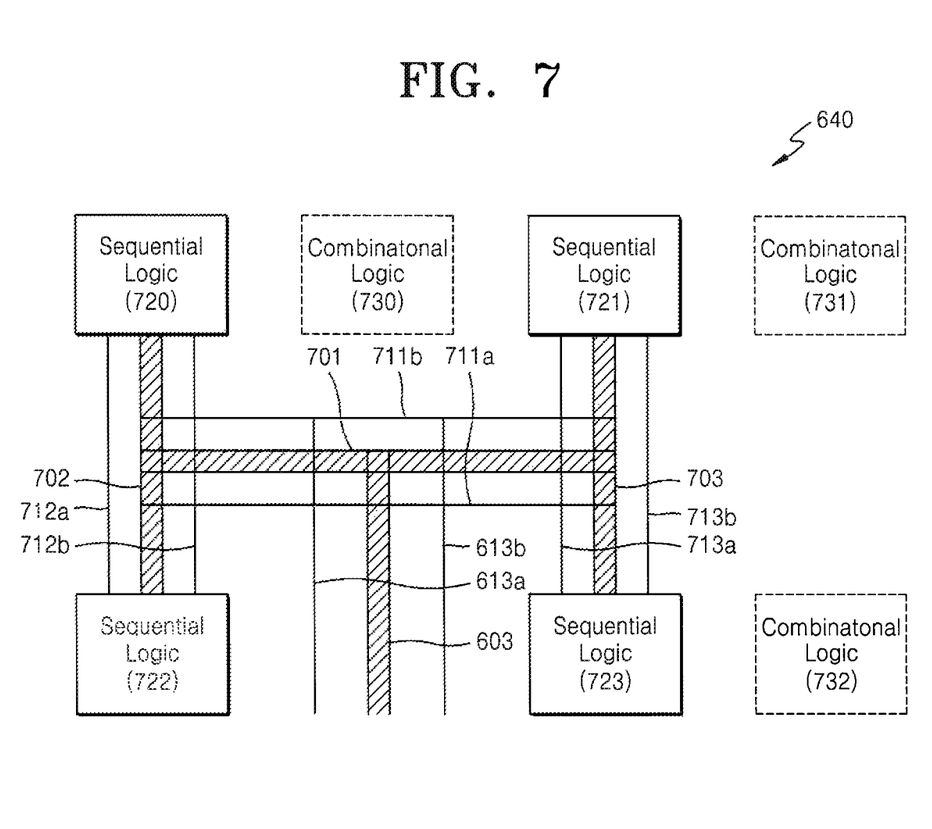
FIG. 7 is a schematic block diagram illustrating a logic block of FIG. 6, according to an exemplary embodiment of the present general inventive concept.

FIG. 7 is a schematic block diagram illustrating the first through fourth logic blocks 640, 641, 642, and 643 of FIG. 6 according to an exemplary embodiment of the present general inventive concept.

Referring to FIGS. 6 and 7, the first logic block 640 may comprise sequential logic circuits 720, 721, 722, and 723, which are ABB circuits, and combinational logic circuits 730, 731, and 732. Each of the logic circuits 720, 721, 722, and 723 may be formed of a transistor and/or a diode. The sequential logic circuits 720, 721, 722, and 723 may be synchronous logic circuits performing logic calculations in synchronization with a clock signal CLK. The sequential logic circuits 720, 721, 722, and 723 may be, for example, a flip flop, a latch, and/or an inter clock-gate. The combinational logic circuits 730, 731, and 732 may be asynchronous logic circuits, and may be an adder, a decoder, and/or a multiplexer. Meanwhile, while the first logic block 640 comprises four sequential logic circuits 720, 721, 722, and 723 and three combinational logic circuits 730, 731, and 732, the exemplary embodiment of the present general inventive concept is not limited thereto. The second through fourth logic blocks 641, 642, and 643 may also have the same structure.

Local clock signal lines 701, 702, and 703 are signal lines through which a clock signal is transmitted to the sequential logic circuits. The local clock signal lines 701, 702, and 703 may be distributed, for example, in an H-tree clock signal distribution manner. Referring to FIG. 7, the local clock signal line 702 connects the sequential logic circuit 720 and the sequential logic circuit 722. The local clock signal line 703 connects the sequential logic circuit 721 and the sequential logic circuit 723. The local clock signal line 701 connects the local clock signal line 702 and the local clock signal line 703. The local clock signal line 701 is connected to the main clock signal line 603 to transmit a clock signal CLK. Accordingly, the clock signal CLK transmitted through the main clock signal line 603 may be hierarchically transmitted to the sequential logic circuits 720, 721, 722, and 723 via the local clock signal lines 701, 702, and 703. Wirings of the local clock signal lines 701, 702, and 703 of the first logic block 640 are not limited to the H-tree wiring manner, but may also be wired as a power mesh of a power voltage and/or a ground voltage, and/or in other various manners according to the arrangement and wirings of the sequential logic circuits 720, 721, 722, and 723.

The local bias lines 711a, 711b, 712a, 712b, 713a, and 713b are connected to the sequential logic circuits to apply a bias voltage $V_{ABB}$. In detail, the main bias lines 613a and 613b and the local bias lines 711a and 711b are connected, and the local bias lines 712a, 712b, 713a, and 713b are connected to the local bias lines 711a and 711b. The local bias lines 712a, 712b, 713a, and 713b are connected to a body terminal of a MOS transistor constituting each of the sequential logic circuits 720, 721, 722, and 723 to apply a bias voltage $V_{ABB}$. The bias voltage $V_{ABB}$ may be applied in the same manner as described above, and thus a description thereof will be omitted here.

Referring to FIG. 7 further, each of the local bias lines 711a, 711b, 712a, 712b, 713a, and 713b forms a pair with the local clock signal lines 701, 702, and 703, and are arranged adjacent to the local clock signal lines 701, 702, and 703 at a predetermined distance from the local clock signal lines 701, 702, and 703 of the pairs. According to the current embodiment, two local bias lines are each paired with one local clock signal line, and are arranged parallel at two sides of each of the local clock signal lines. In detail, the local bias lines 711a and 711b are each in pairs with the local clock signal line 701 and are arranged parallel at opposite sides of the local clock signal line 701. In this case, the distance between the lines may be a distance that is a multiple of widths of the local clock signal lines. Likewise, the local bias lines 712a and 712b are each in pairs with the local clock signal line 702, and the local bias lines 713a and 713b are each in pairs with the local clock signal line 703. While two local bias lines are each arranged parallel in pairs with one local clock signal line, one local bias line and one local clock line may also be arranged in pairs. By arranging local bias lines as described above, a leakage current and an operating speed of a semiconductor IC may be controlled through ABB. Moreover, a clock signal CLK may be shielded from crosstalk due to adjacent signal lines. Accordingly, a malfunction of the semiconductor IC may be prevented.

Referring to FIG. 7 further, in the first logic block 640, local clock signal lines and local bias lines may be connected to the sequential logic circuits 720, 721, 722, and 723. In at least one exemplary embodiment, logic circuits constituting ABB circuit may be sequential logic circuits, and ABB may be performed only with respect to the sequential logic circuits. The combinational logic circuits 730, 731, and 732 are not synchronized with the clock signal CLK, and do not include a memory device, unlike the sequential logic circuits. Thus, an influence of a leakage current of the combinational logic circuits 730, 731, and 732 is minimal, thereby insignificantly affecting a leakage current and an operational speed of a semiconductor IC. Consequently, by applying a bias voltage to synchronous sequential logic circuits, which has a major effect on controlling of the leakage current and the operational speed (of the semiconductor IC), consumption of wiring resources may be reduced, and a semiconductor IC may be designed easily.

Referring to FIG. 6 again, the main clock signal lines 601, 602, 603, and 604 are signal lines through which a clock signal CLK is transmitted to the first through fourth logic blocks 640, 641, 642, and 643. The clock signal CLK may be supplied from a clock signal generator inside a semiconductor circuit 600 and/or from the outside. The clock signal CLK may be supplied to a logic circuit of the first through fourth logic blocks 640, 641, 642, and 643 as an input signal and may control operation timing of the logic circuit.

According to at least one exemplary embodiment of the present general inventive concept, the main clock signal lines 601, 602, 603, and 604 may be arranged in an H-tree clock signal distribution manner. Referring to FIG. 6, the main clock signal line 603 connects the first logic block 640 and the third logic block 642, main clock signal line 604 connects the first logic block 641 and the third logic block 643, main clock signal line 602 connects the main clock signal line 603 and the main clock signal line 604, and main clock signal line 601 connects the main clock signal line 602 and a clock signal transmission port 650. That is, a main clock signal may be sequentially applied to the logic blocks. Accordingly, a clock signal CLK input to the clock signal transmission port 650 is hierarchically transmitted to the first through fourth logic blocks 601, 602, 603, and 604 via the main clock signal lines 601, 602, 603, and 604. To reduce signal delay and distortion of the clock signal CLK that is distributed in an H-tree structure, each of the main clock signal lines 601, 602, 603, and 604 may be divided into predetermined areas and a clock signal may be directly transmitted to each of the main clock signal lines 601, 602, 603, and 604. That is, a clock signal transmission port may be included in each predetermined area to directly transmit a clock signal to a main clock signal line of each area. While the H-tree distribution method is described as an example of an arrangement of the main clock signal lines according to a clock distribution method, the exemplary embodiment of the present general inventive concept is not limited thereto. The main clock signal lines may be arranged as a power mesh of power and ground voltages, and in various manners according to placement and routing of the first through fourth logic blocks 640, 641, 642, and 643.

The main bias lines 611a, 611b, 612a, 612b, 613a, 613b, 614a, and 614b are connected to the first through fourth logic blocks 640, 641, 642, and 643 to apply a bias voltage $V_{ABB}$ to a logic circuit included in each of the first through fourth logic blocks 640, 641, 642, and 643. In detail, the main bias lines 611a, 611b, 612a, 612b, 613a, 613b, 614a, and 614b apply a bias voltage $V_{ABB}$ to a body terminal of a MOS transistor constituting the logic circuits of the first through fourth logic blocks 640, 641, 642, and 643. The bias voltage $V_{ABB}$ may have a predetermined level, and may be applied from the outside and/or from an internal adaptive bias voltage generator.

A voltage level of the applied bias voltage $V_{ABB}$ may be different from a level of a power voltage and/or a ground voltage. Also, the voltage level of the bias voltage $V_{ABB}$ may be varied according to an operating condition of the semiconductor IC 600 by using an ABB control circuit. The bias voltage $V_{ABB}$ may be applied to logic circuits of the first through fourth logic blocks 640, 641, 642, and 643 as a forward bias voltage and/or a reverse bias voltage. By using the bias voltage $V_{ABB}$, the leakage current and the operating speed of the logic circuits included in the semiconductor IC 600 may be controlled. That is, an ABB circuit may be implemented with respect to the semiconductor IC 600.

Referring to FIG. 6 further, the main bias lines 611a, 611b, 612a, 612b, 613a, 613b, 614a, and 614b are formed in pairs with the main clock signal lines 601, 602, 603, and 604, and are arranged adjacent to the main clock signal lines 601, 602, 603, and 604. According to at least one exemplary embodiment, pairs of main bias lines 611a,611b;612a, 612b; 613a, 613b; 614a, 614b are arranged adjacent to a respective main clock signal line among the main clock signal lines 601, 602, 603, and 604, and are arranged in parallel at two sides of the main clock signal lines 601,602, 603, 604. For example, the main clock signal line 601 is arranged adjacent to the pair of main bias lines 611a and 611b, and the main bias lines 611a and 611b are arranged parallel to the main clock signal line 601 at opposite sides of the main clock signal line 601. In this exemplary embodiment, a distance between the lines may be a distance which is a multiple of a width of the main clock signal line 601 as described above, and the main bias lines 611a and 611b may be arranged adjacent to the main clock signal line 601. Likewise, the main bias lines 612a and 612b may be arranged in a pair with the main clock signal line 602, the main bias lines 613a and 613b may be arranged in a pair with the main clock signal line 603, and the main bias lines 614a and 614b may be arranged in a pair with the main clock signal line 604. Accordingly, the main bias lines 611a, 611b, 612a, 612b, 613a, 613b, 614a, and 614b shield a clock signal CLK from crosstalk due to adjacent signal lines. Also, while at least one exemplary embodiment provides the main bias lines 611a, 611b, 612a, 612b, 613a, 613b, 614a, and 614b arranged in an H-tree distribution manner like the main clock signal lines 601, 602, 603, and 604, the present general inventive concept is not limited thereto, and the main bias lines 601, 602, 603, 604 may be arranged according to other distribution methods including, but not limited to a clock signal distribution method.

Meanwhile, while FIG. 6 illustrates the semiconductor IC 600 including two main bias lines 613a, 613b; 614a, 614b that are arranged in parallel in pairs with one main clock signal line 603, 604, the exemplary embodiment of the present general inventive concept is not limited thereto. Alternatively, one main bias line may be arranged in a pair with one main clock signal line. In this exemplary embodiment, the main bias line may be arranged in parallel to the main clock signal line at a first side of the main clock signal line. Alternatively, one main bias line and one power voltage line or one ground voltage line may form pairs with a main clock signal line. In addition, while two main bias lines 613a, 613b are arranged in parallel with a main clock signal line 603 in FIG. 6, the exemplary embodiment of the present general inventive concept is not limited thereto. The main bias lines may be arranged in various other ways, which will be described in detail below with reference to FIG. 8.

Figure 8A:
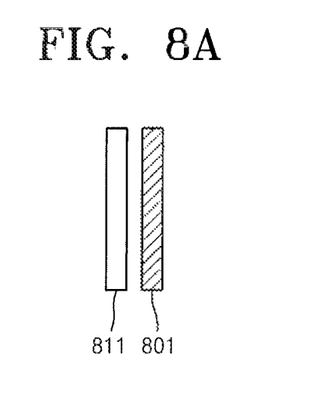
FIGS. 8A through 8D are diagrams illustrating wiring examples of a main bias line in the semiconductor IC of FIG. 6.
Figure 8B:
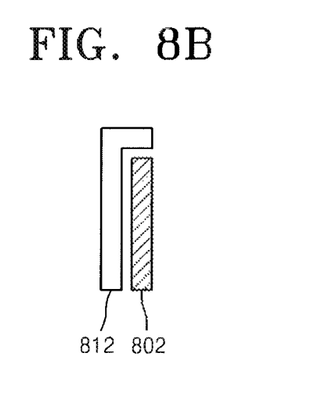
Figure 8C:
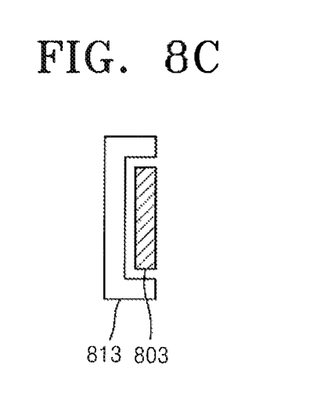
Figure 8D:
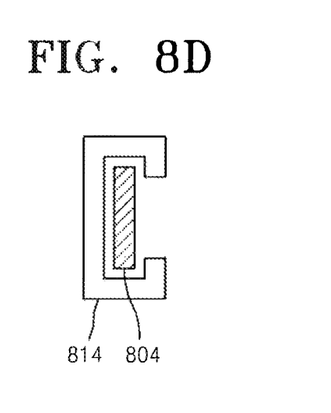

FIGS. 8A through 8D are diagrams illustrating wiring examples of a main bias line in the semiconductor IC 600 of FIG. 6. FIG. 8A illustrates the above-described example of one main bias line 811 and one main clock signal line 801 that are arranged in parallel to each other. FIG. 8B illustrates a main bias line 812 having an "L" shape and a main clock signal line 802 that are arranged in pairs. FIG. 8C illustrates a main bias line 813 having a "C" shape and a main clock signal line 803 that are arranged in pairs. FIG. 8D illustrates a modified example of the arrangement of FIG. 8C, in which a main bias line 814 surrounds three sides of a main clock signal line 804 and portions of the remaining one side of the main clock signal line 804. FIGS. 8A through 8D illustrate one main bias line, but the present exemplary embodiment of the present general inventive concept is not limited thereto, and two main bias lines may also be arranged. The above-described shapes of the main bias line may also be applied to the shapes of the bias lines 130a, 130b, 430a, and 430b of FIGS. 1 and 4A through 4D and the shapes of the local bias lines 711a, 711b, 712a, 712b, 713a, and 713b of FIG. 7.

As described above, according to the semiconductor IC 600 of at least one exemplary embodiment of the present general inventive concept, the leakage current and the operational speed of the semiconductor IC 600 may be controlled through ABB, and thus the semiconductor IC 600 may be effectively controlled considering both power consumption and performance. Also, by arranging the main bias lines and the local bias lines in pairs with the main and local clock signal lines as described above, a power mesh of a bias voltage is not necessary to conduct ABB, and also an additional clock shield structure is not necessary. Thus, a circuit design may be simplified, and consumption of wiring resources may be significantly reduced. In addition, a bias voltage is applied to sequential logic circuits which have a major effect on controlling of the leakage current and the operational speed, and thus the consumption of the wiring resources may be further reduced.

Figure 9A:
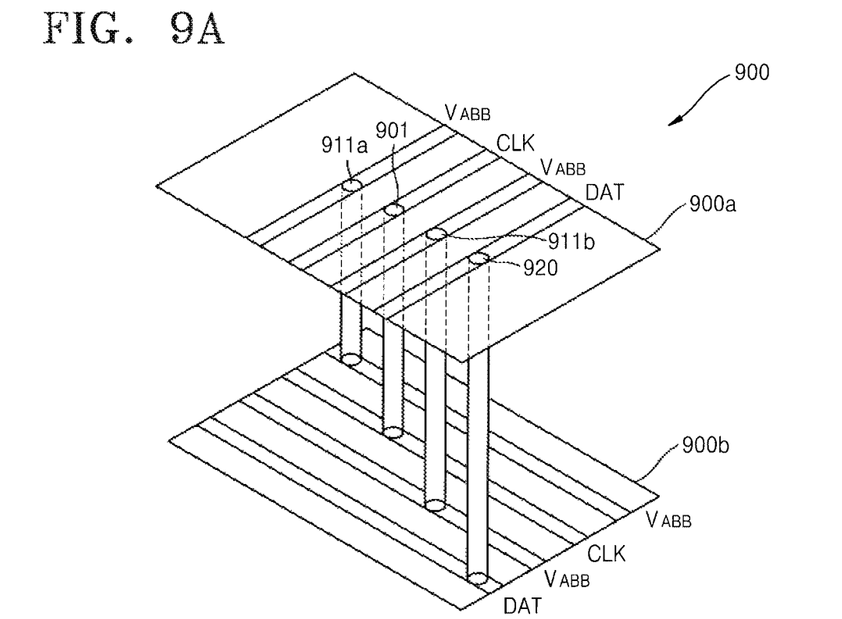
FIGS. 9A and 9B are perspective views illustrating wiring relationships of through electrodes, interlayer clock signal lines, and bias lines in a stack-type semiconductor IC according to exemplary embodiments of the present general inventive concept.
Figure 9B:
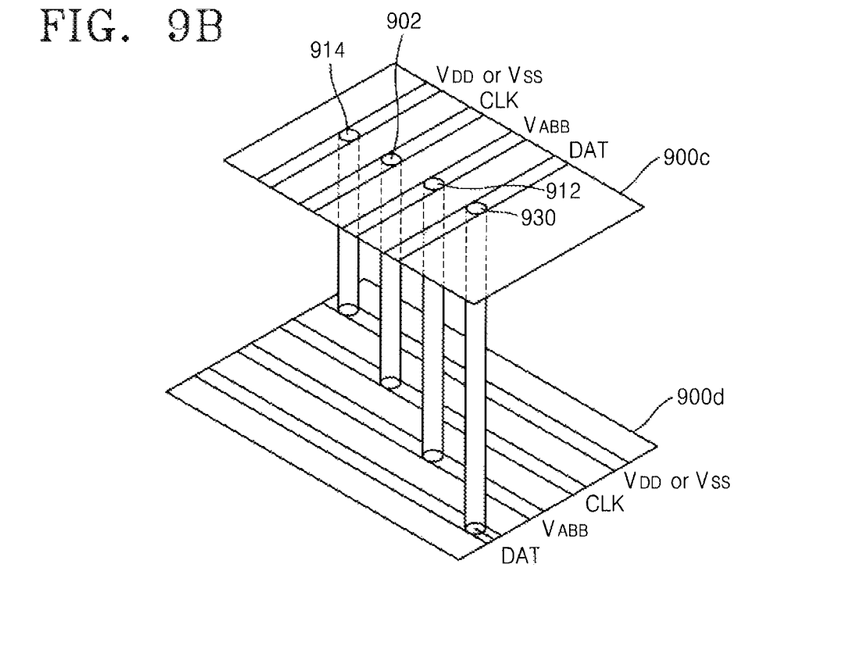

FIGS. 9A and 9B are perspective views illustrating wiring relationships of through electrodes and interlayer clock signal lines and bias lines in a stack-type semiconductor IC 900 according to exemplary embodiments of the present inventive concept. First, each of single layers 900a, 900b, 900c, and 900d of a stack-type semiconductor IC may be the semiconductor IC 600 of FIG. 6. Clock signal lines are electrically connected to one another between the semiconductor ICs of each layer via through electrodes. Also, bias lines are electrically connected to one another between the semiconductor ICs of each layer via through electrodes. That is, each of the lines may be vertically electrically connected to one another via the through electrodes that pass through from a surface of a substrate of each of the semiconductor ICs to the other side of the substrate.

FIG. 9A illustrates through electrodes 911a and 911b that connect interlayer bias lines at two sides of a through electrode 901 which electrically connects clock signal lines between a single layer 900a and another single layer 900b of the stack-type semiconductor IC 900. Accordingly, the through electrodes 911a and 911b may shield a clock signal CLK from crosstalk existing at a through electrode 920 which connects data signal lines (DAT).

FIG. 9B illustrates a through electrode 912 that electrically connects bias lines $V_{ABB}$. The through electrode 912 is disposed at a first side of a through electrode 902 that connects clock signal lines, between a single layer 900c and another single layer 900d of a stack-type semiconductor IC. In FIG. 9B, a through electrode 914, through which a power voltage $V_{DD}$ or a ground voltage $V_{SS}$ is applied, may be disposed at a second side, opposite to the first side, of the through electrode 902 connecting clock signal lines. As described above, by using the through electrode 912 of interlayer bias lines $V_{ABB}$, a clock signal CLK may be shielded from crosstalk due to a through electrode 930, which connects data signal lines (DAT). Accordingly, operational reliability of the stack-type semiconductor IC 900 may be further improved.

Figure 10:
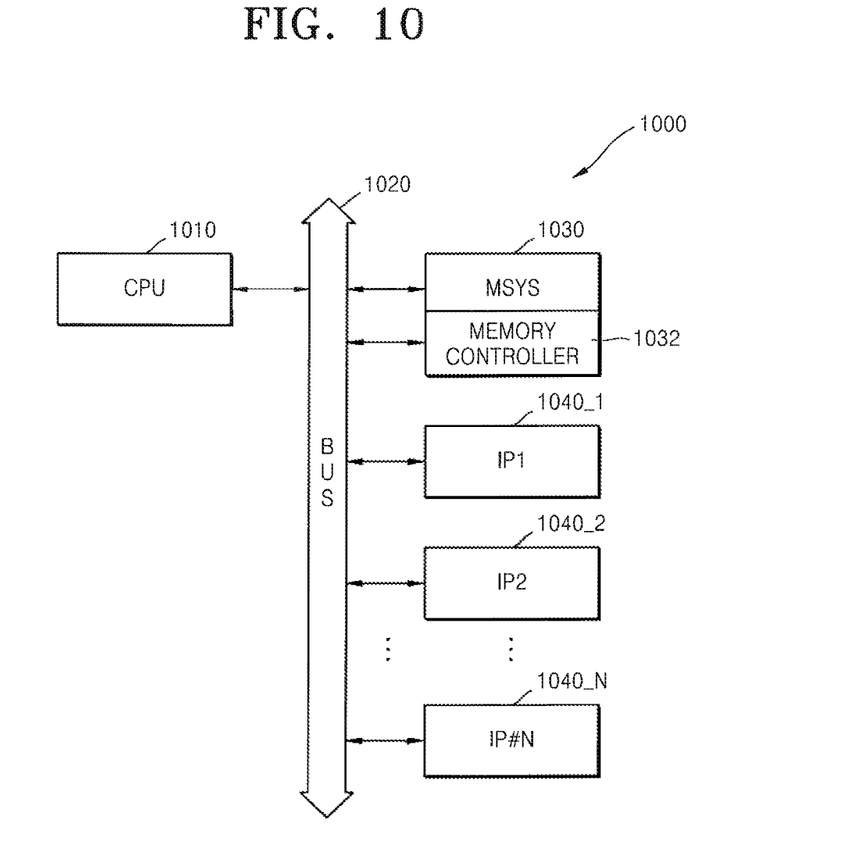
FIG. 10 is a schematic block diagram illustrating a system on chip (SoC) including the semiconductor IC of FIG. 6, according to an exemplary embodiment of the present general inventive concept.

FIG. 10 is a schematic block diagram illustrating a system on chip (SoC) 1000 comprising a plurality of the semiconductor ICs 600 of FIG. 6. In at least one exemplary embodiment, the SoC 1000 comprises a plurality of semiconductor ICs, each comprising at least one ABB circuit 100. Referring to FIG. 10, the SoC 1000 may include a central processing unit (CPU) 1010, a system bus 1020, a memory system (MSYS) 1030, and first through n-th intellectual properties (IPs) 1040_1 through 1040_N. The CPU 1010 may control a memory controller 1032 of the memory system (MSYS) 1030 and specific operations of the first through n-th intellectual properties 1040_1 through 1040_N. The system bus 1020 may be electrically connected to the CPU 1010, the memory system (MSYS) 1030, the memory controller 1032, and the plurality of IPs 1040_1 through 1040_N to one another to allow communication with one another. The first through n-th IPs 1040_1 through 1040_N may perform specific operations according to the function of the SoC 1000.

The CPU 1010 and the first through n-th IPs 1040_1 through 1040_N of the SoC 1000 may be formed of a large number of semiconductor devices such as logic circuits, and the semiconductor devices may be integrated like the semiconductor IC 600 of FIG. 6. That is, the logic circuits constituting the SoC 1000 may be formed in the same manner as the ABB circuits according to the present exemplary embodiment of the present general inventive concept. Accordingly, when designing the SoC 1000, consumption of the wiring resources may be reduced, and the design may be simplified. Also, an ABB circuit may be implemented, and thus the leakage current and the performance of the SoC 1000 may be controlled, thereby preventing crosstalk to improve operational reliability of the SoC 1000.

Figure 11:
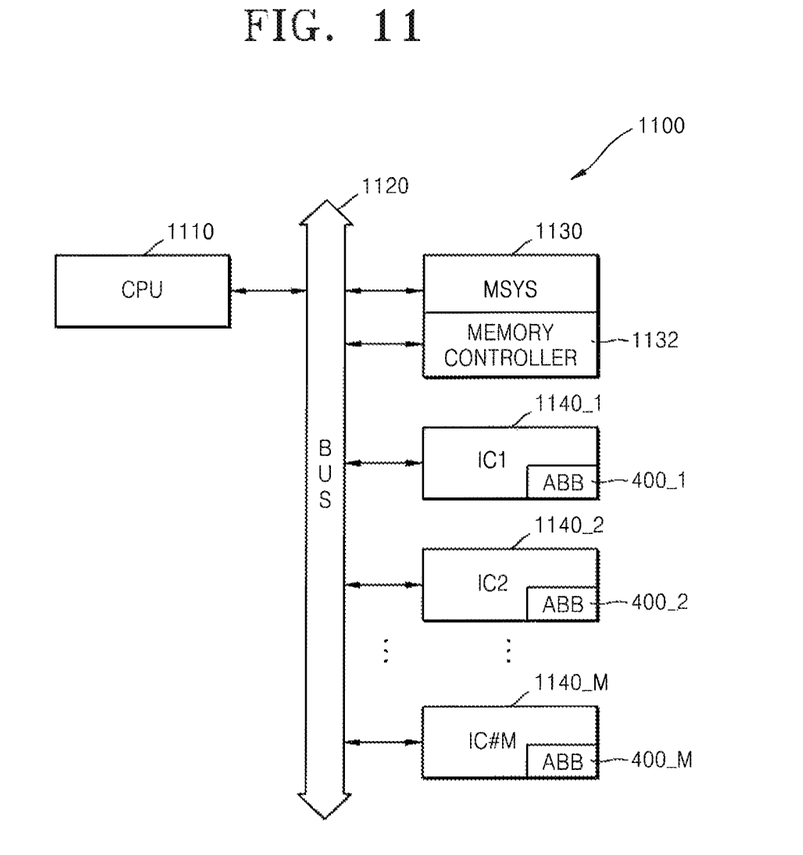
FIG. 11 is a schematic block diagram illustrating a system on chip (SoC) including semiconductor ICs that each include at least one adaptive body bias (ABB) circuit 400 of FIG. 4A, according to an exemplary embodiment of the present general inventive concept.

FIG. 11 illustrates a schematic block diagram of a system on chip (SoC) 1100 including semiconductor ICs IC1, IC2, . . . IC#M, where M is a positive integer, that each include at least one adaptive body bias (ABB) circuit 400 of FIG. 4A, according to an exemplary embodiment of the present general inventive concept. The system on a chip (SoC) 1100 thus includes a plurality of semiconductor integrated circuits IC1, IC2, . . . IC#M, each including at least one adaptive body bias (ABB) circuit 400_1, 400_2, . . . 400_M. Each ABB circuit 400_1, 400_2, . . . , 400_M includes a logic circuit 420 performing logic calculations, a clock signal line 440 through which a clock signal is transmitted to the logic circuit 420; and at least one bias line 430 through which a bias voltage is applied to the logic circuit 420, wherein the bias voltage is applied to a body of a metal oxide semiconductor (MOS) transistor constituting the logic circuit 420, and the at least one first bias line 430 is arranged at a predetermined distance d1 from the clock signal line 440 to shield the clock signal from crosstalk due to other adjacent signal lines such as signal line 450, and the like.

In addition, the SoC 1100 includes a memory system (MSYS) 1130 having a memory controller 1132, a central processing unit (CPU) 1110 controlling the memory controller 1132 and operations of the plurality of semiconductor integrated circuits IC1, IC2, . . . IC#M, and a system bus 1120 electrically connected to the central processing unit 1110, the memory system 1130; and the plurality of semiconductor integrated circuits IC1, IC2, . . . IC#M. The logic circuits constituting the SoC 1100 may be formed in the same manner as the ABB circuits according to the present exemplary embodiment of the present general inventive concept. Accordingly, when designing the SoC 1100, consumption of the wiring resources may be reduced, and the design may be simplified. Also, an ABB circuit may be implemented, and thus the leakage current and the performance of the SoC 1100 may be controlled, thereby preventing crosstalk to improve operational reliability of the SoC 1100.

Although a few exemplary embodiments of the present general inventive concept have been shown and described, it will be appreciated by those skilled in the art that changes may be made in these exemplary embodiments without departing from the principles and spirit of the present general inventive concept, the scope of which is defined in the appended claims and their equivalents.

What is claimed is:

1. A semiconductor integrated circuit (IC) comprising:
    first through fourth logic blocks each comprising at least one adaptive body bias (ABB) circuit;
    a plurality of main clock signal lines through which a clock signal is transmitted to the first through fourth logic blocks; and
    a plurality of main bias lines that are arranged in pairs with the plurality of main clock signal lines and at a predetermined distance from the plurality of main clock signal lines, and shield the main clock signals from crosstalk due to other adjacent signal lines, wherein a bias voltage is applied to the first through fourth logic blocks through the plurality of main bias lines,
    wherein the ABB circuit comprises:
    a logic circuit performing logic calculations;
    a local clock signal line that is connected to the main clock signal lines to transmit the clock signal to the logic circuit; and
    at least one local bias line that is connected to the main bias lines to apply the bias voltage to the logic circuit, and is arranged at a predetermined distance from the local clock signal line, and shields the local clock signal from crosstalk due to other adjacent signal lines,
    wherein the bias voltage is a voltage applied to a body of a MOS transistor constituting the logic circuit.

2. The semiconductor IC of claim 1, wherein the main clock signal lines and the local clock signal line are arranged in an H-tree clock signal distribution manner.

3. The semiconductor IC of claim 2, further comprising:
    a clock signal transmission port hierarchically transmitting the clock signal to a predetermined area of each of the main clock signal lines via the logic circuit of the at least one adaptive body bias (ABB) circuit.

4. The semiconductor IC of claim 1, wherein the main bias lines are arranged adjacent to the main clock signal lines at a distance that has a magnitude of a multiple of a width of the main clock signal lines.

5. The semiconductor IC of claim 1, wherein two main bias lines are arranged in a pair with one main clock signal line of the plurality of main clock signal lines, wherein the two main bias lines are respectively arranged at opposite sides of the one main clock signal line.

6. The semiconductor IC of claim 1, wherein one main bias line is arranged in a pair with one main clock signal line of the plurality of main clock signal lines, wherein the main bias line is arranged at a side of the one main clock signal line.

7. The semiconductor IC of claim 6, further comprising a plurality of power lines through which a power voltage is applied to the ABB circuit of the first through fourth logic blocks and a plurality of ground lines through which a ground voltage is applied to the ABB circuit of the first through fourth logic blocks, wherein one of the plurality of power lines and the plurality of ground lines is arranged at an opposite side to the one main bias line arranged in parallel with the one main clock signal line.

8. The semiconductor IC of claim 1, wherein the logic circuit comprises a sequential logic circuit performing logic calculations in synchronization with the clock signal.

9. The semiconductor IC of claim 1, wherein the bias voltage has a different level from a level of a power voltage applied to the logic circuit, and the bias voltage is a forward bias voltage or a reverse voltage.

10. The semiconductor IC of claim 1, wherein one main bias line is arranged in a pair with one main clock signal line of the plurality of main clock signal lines, and wherein the one main bias line is arranged at a side of the one main clock signal line, the one main bias line having an "L" shape.

11. The semiconductor IC of claim 1, wherein one main bias line is arranged in a pair with one main clock signal line of the plurality of main clock signal lines, and wherein the one main bias line is arranged at a side of the one main clock signal line, the one main bias line having a "C" shape.

12. The semiconductor IC of claim 1, wherein one main bias line is arranged in a pair with one main clock signal line of the plurality of main clock signal lines, and wherein the one main bias line is arranged at a side of the one main clock signal line, the one main bias line surrounds three sides of the main clock signal line and portions of the remaining one side of the main clock signal line.

* * * * *